United States Patent
Tamura et al.

(10) Patent No.: US 9,559,073 B2
(45) Date of Patent: Jan. 31, 2017

(54) BASE FILM AND PRESSURE-SENSITIVE ADHESIVE SHEET PROVIDED THEREWITH

(75) Inventors: Kazuyuki Tamura, Tokyo (JP); Takashi Akutsu, Tokyo (JP); Yuki Eto, Tokyo (JP); Tomohide Hukuzaki, Osaka (JP)

(73) Assignees: LINTEC Corporation, Tokyo (JP); Arakawa Chemical Industries, LTD, Osaka (JP)

( * ) Notice: Subject to any disclaimer, the term of this patent is extended or adjusted under 35 U.S.C. 154(b) by 0 days.

(21) Appl. No.: 14/005,574

(22) PCT Filed: Mar. 22, 2012

(86) PCT No.: PCT/JP2012/057304
§ 371 (c)(1),
(2), (4) Date: Dec. 1, 2013

(87) PCT Pub. No.: WO2012/128311
PCT Pub. Date: Sep. 27, 2012

(65) Prior Publication Data
US 2014/0079947 A1    Mar. 20, 2014

(30) Foreign Application Priority Data
Mar. 22, 2011 (JP) ................. 2011-062942

(51) Int. Cl.
*H01L 23/00* (2006.01)
*C09J 7/02* (2006.01)
*H01L 21/683* (2006.01)

(52) U.S. Cl.
CPC ............. *H01L 24/29* (2013.01); *C09J 7/0217* (2013.01); *C09J 7/0282* (2013.01); *H01L 21/6836* (2013.01); *C09J 2203/326* (2013.01); *C09J 2475/006* (2013.01); *H01L 2221/6834* (2013.01); *H01L 2221/68327* (2013.01); *H01L 2924/12042* (2013.01); *Y10T 428/2848* (2015.01); *Y10T 428/31551* (2015.04)

(58) Field of Classification Search
CPC ... C09J 7/0217; C09J 7/0282; C09J 2203/006; C09J 2475/006; Y10T 428/2848; Y10T 428/31551; Y10T 428/31554; Y10T 428/31562; Y10T 428/31565; Y10T 428/3158; Y10T 428/31591; H01L 24/29; H01L 2221/68327; H01L 2221/6834; H01L 2924/12042
USPC .......... 428/354, 423.1, 423.3, 423.4, 423.7,4 28/424.6, 425.1
See application file for complete search history.

(56) References Cited

U.S. PATENT DOCUMENTS

| | | | |
|---|---|---|---|
| 5,278,199 A * | 1/1994 | Ohkawa et al. | ................ 522/95 |
| 5,322,861 A | 6/1994 | Tsuge et al. | |
| 6,002,383 A | 12/1999 | Shimada | |
| 6,200,732 B1 | 3/2001 | Tamura et al. | |
| 6,309,747 B1 | 10/2001 | Suwa et al. | |
| 6,310,133 B1 | 10/2001 | Katashima et al. | |
| 6,333,283 B1 | 12/2001 | Urano et al. | |
| 6,350,790 B1 | 2/2002 | Bishop et al. | |
| 6,524,701 B1 * | 2/2003 | Kondo et al. | .......... 428/355 RA |
| 6,793,672 B2 | 9/2004 | Khosravi et al. | |
| 2005/0269717 A1 | 12/2005 | Ohashi et al. | |
| 2006/0188725 A1 | 8/2006 | Yoshida et al. | |
| 2007/0021521 A1 | 1/2007 | Cheng et al. | |
| 2007/0054088 A1 | 3/2007 | Matijasic et al. | |
| 2007/0224430 A1 | 9/2007 | Iwanaga | |
| 2008/0118752 A1 | 5/2008 | Inoue et al. | |
| 2010/0247906 A1 | 9/2010 | Lee et al. | |
| 2010/0295190 A1 | 11/2010 | Mitsukura et al. | |
| 2011/0021705 A1 | 1/2011 | Imoto et al. | |
| 2011/0070433 A1* | 3/2011 | Fujimoto et al. | ............. 428/345 |
| 2011/0117364 A1 | 5/2011 | Uesugi et al. | |
| 2014/0065414 A1 | 3/2014 | Tamura et al. | |

FOREIGN PATENT DOCUMENTS

| | | |
|---|---|---|
| JP | S60196956 A | 10/1985 |
| JP | S60223139 A | 11/1985 |
| JP | S63153814 A | 6/1988 |
| JP | S63296222 A | 12/1988 |
| JP | 11-343469 A | 12/1999 |
| JP | 2004-288725 A | 10/2004 |
| JP | 2005-109433 A | 4/2005 |
| JP | 2005-123382 A | 5/2005 |
| JP | 2005-343997 A | 12/2005 |

(Continued)

OTHER PUBLICATIONS

International Application No. PCT/JP2012/057304, Notification of the Transmittal of Translation of the International Preliminary Report on Patentability, dated Sep. 24, 2013.
International Application No. PCT/JP2012/057304, International Search Report, dated Apr. 24, 2012.
English Abstract of JP 11-343469.
English Abstract of JP 2005-343997.
English Abstract of JP 2010-254853.
English Abstract of JP 2011-32410.
English Abstract of WO 2012128312.
English Abstract of JP 2005-123382.
English Abstract of JP 2004-288725.
English Abstract of JP 2005-109433.

(Continued)

*Primary Examiner* — Thao T Tran
(74) *Attorney, Agent, or Firm* — Cahn & Samuels, LLP

(57) ABSTRACT

To prevent bumps on the circuit side of a bump-bearing wafer from getting crushed when grinding the back side of said wafer while protecting the circuit side with a surface-protection sheet, and also to minimize the formation of dimples and cracks on the side being ground.
[Solution] This base film for a pressure-sensitive adhesive sheet bonded to a semiconductor wafer comprises: (A) a layer obtained by using energy rays to cure a formulation containing a urethane (meth)acrylate oligomer and a thiol-group-containing compound; and (B) a layer comprising a thermoplastic resin.

11 Claims, No Drawings

(56) References Cited

FOREIGN PATENT DOCUMENTS

| JP | 3739570 B2 | 1/2006 |
|---|---|---|
| JP | 2010-254853 A | 11/2010 |
| JP | 2011-32410 A | 2/2011 |
| JP | 2011171688 A | 9/2011 |
| WO | 0147824 A1 | 7/2001 |
| WO | 2012128312 A1 | 9/2012 |

OTHER PUBLICATIONS

English Abstract of JP 3739570.
English Abstract of JP 2011171688.
English Abstract of JP S60196956.
English Abstract of JP S60223139.
English Abstract of JPS63153814.
English Abstract of JP H0577284.
English Abstract of JP S63296222.

* cited by examiner

BASE FILM AND PRESSURE-SENSITIVE ADHESIVE SHEET PROVIDED THEREWITH

This application is a U.S. national stage application of PCT/JP2012/057304 filed on 22 Mar. 2012 which claims priority of Japanese patent document 2011-062942 filed on 22 Mar. 2011, the entireties of which are incorporated herein by reference.

TECHNICAL FIELD

The present invention relates to a base film used as a base of a surface protection pressure sensitive adhesive sheet which is preferably used to protect a circuit face of a semiconductor wafer formed with a circuit on a surface, and particularly relates to a base film preferably used for the surface protection pressure sensitive adhesive sheet of the semiconductor wafer formed on a surface with bumps having large height differences. Also, the present invention relates to a pressure sensitive adhesive sheet preferably used as the surface protection pressure sensitive adhesive sheet of the semiconductor wafer comprising a pressure sensitive adhesive agent layer on said base film.

DESCRIPTION OF THE RELATED ART

While an information terminal apparatus is rapidly becoming thinner, smaller and more multifunctional; a semiconductor which is mounted thereon is also demanded to become further thinner, and to have higher density. In order to make the device further thinner, it is demanded to further thinner a semiconductor wafer to which the semiconductor is integrated. Also, along with having higher density, further improvement is demanded for the mounting technology of the semiconductor chip wherein the spherical bumps having diameter of several hundred μm or so made of solder or so are mounted on the circuit face. Usually, the bumps are bonded in high density at the semiconductor wafer in advance. When grinding the backside of such wafer with the bump, the pressure difference caused by the difference of the height between the part with the bumps and the part without the bumps directly influences to the wafer backside, and causes grooves or cracks which are called dimple on the wafer backside, and eventually breaks the semiconductor wafer.

Therefore, when carrying out the backside grinding of the wafer with the bumps, the surface protection sheet is pasted to the circuit surface to relieve the height difference of the circuit face. Particularly, to the wafer having large height differences of the bumps, the thickness of the adhesive layer is made thicker, and by making the fluidity of the adhesive agent higher, the adhesive layer and the wafer are adhered; thereby the pressure difference caused by the difference between the bumps are intended to solve by the cushion property of the adhesive layer. However, by making the thickness of the adhesive layer thicker and making the fluidity thereof higher, the adhesive layer easily reaches the bottom portion of the bumps. Therefore, the adhesive agent adhered to the bottom portion of the bump causes the interlayer fracture due to the releasing procedure of the surface protection sheet, and a part thereof may remain on the circuit surface. This problem occurred even when using the surface protection sheet using the energy ray curable adhesive agent. The adhesive agent which remained on the circuit face must be removed by solvent washing or so, otherwise it would remain in the device as the foreign matter, and would compromise the reliability of the completed device.

In order to solve such problem, the patent article 1 (JP Patent Application Laid Open No. 2005-123382) discloses the surface protection sheet provided with, on one side of the base sheet, the opening part without the adhesive agent layer and having a smaller diameter than the outer diameter of the semiconductor wafer being laminated, and the part having the adhesive layer formed at the outer peripheral thereof, and the grinding method using said surface protection sheet. This surface protection sheet has a structure wherein the both sides adhesive sheet is punched out in a ring form at one side of the base sheet, and does not have the adhesive agent at the part where the bumps contacts, thus it can be used without having the adhesive agent adhered to the bottom part of the bumps.

Also, the patent article 2 (JP Patent Application Laid Open No. 2004-288725) discloses the production method of the semiconductor apparatus comprising a step of forming the semiconductor element which forms plurality of electrode pads at a predetermined position on an active power face of the IC wafer, and a step of bump forming wherein bumps are formed on said pad, a step of back grinding wherein a non-active power face of said IC wafer is ground to a predetermined thickness; wherein at said bump forming step, the bumps are formed besides the peripheral portions of said IC wafer, and between said bump forming step and said back grinding step, a step of forming the supporting member in which the supporting member is formed or pasted to said peripheral part; further, it is characterized that at said back grinding step, the grinding of said non-active power face is carried out while supporting the peripheral portion of said IC wafer by said supporting member.

The patent article 3 (JP Patent Application Laid Open No. 2005-109433) discloses the surface protection sheet which is a protection member of protecting the backsides of the semiconductor wafer formed with the bump on the surface, comprising the outer peripheral adhering part adhered to the outer peripheral area of the semiconductor wafer without the bumps, the bump protection part protecting the and supporting the bump by surrounded by said outer peripheral adhering part, and a concave part housing the bumps which is formed by said outer peripheral adhering part and the bump protection part.

In the grinding method of the above articles, the outer peripheral of the bump forming face of the wafer are surrounded by the adhesive agent, and the bump forming face is covered by the base sheet (resin film) having approximately the wafer shape pasted on this adhesive layer, thereby the bump forming face is protected.

When the backside grinding of the wafer is carried out using this protection style, the bump is pressed against the resin film due to the pressure of the grinder used for the grinding. Therefore, the bump on the circuit surface may be collapsed during the backside grinding of the wafer, or the dimple or the cracks were produced on the wafer backside in some cases. Particularly, in case the hardness of the resin film is too high, such problems were more prominent. On the other hand, in case the hardness of the resin film is too low, the shape holding property may become insufficient, and the risk of breaking the wafer increases during transporting which is the next step following the grinding.

The patent article 4 (JP Patent No. 3739570) discloses the surface protection adhesive sheet which uses the base showing special dynamic viscoelasticity, as the surface protection adhesive sheet used for the wafer with the bumps. This surface protection adhesive sheet was able to sufficiently correspond to the wafer having relatively small height differences of the bumps; however when the backside grinding was carried out to the semiconductor wafer having bumps with the height differences exceeding 150 μm to make it extremely thin, then dimples and cracks were produced on the wafer backside in some cases.

[Patent Article 1] JP Patent Application Laid Open No. 2005-123382
[Patent Article 2] JP Patent Application Laid Open No. 2004-288725
[Patent Article 3] JP Patent Application Laid Open No. 2005-109433
[Patent Article 4] JP Patent No. 3739570

SUMMARY OF INVENTION

The present invention is accomplished in view of aforementioned prior arts, and its object is to protect the circuit face of the wafer with the bumps, and to prevent the bumps on the circuit surface form collapsing during the backside grinding, and to suppress the dimples and the cracks from forming on the grinding face; by using the surface protection sheet.

As a result of a keen examination by the present inventors, by placing the resin layer formed of specific resin as the base film of the surface protection sheet, the viscoelasticity of the surface protection sheet is adjusted, the bumps does not collapse even when the bumps are pressed against the sheet, and further the height difference of the wafer surface with the bumps can be relieved, hence the dimples and the cracks can be suppressed from being produced; thereby the present invention was achieved.

The present invention solving the above mentioned problems includes the following gist.

(1) A base film of a pressure sensitive adhesive sheet to be adhered on a semiconductor wafer, comprising (A) a layer of a cured product in which a composition including an urethane (meth)acrylate oligomer and a thiol group containing compound is cured by an energy ray irradiation, and (B) a thermoplastic resin layer.

(2) The base film as set forth in (1), wherein a content of the thiol group containing compound of said composition is 2 mmol or more with respect to 100 g of urethane (meth) acrylate oligomer.

(3) A pressure sensitive adhesive sheet comprising a pressure sensitive adhesive layer on the base film as set forth in (1) or (2).

The present invention is accomplished in view of aforementioned prior arts, and according to the present invention, by using the surface protection sheet, while protecting the circuit surface of the wafer with the bumps, the bumps on the circuit face are prevented from collapsing when grinding the backside, and further the production of the dimples and the cracks on the grinding face can be suppressed.

DETAILED DESCRIPTION OF THE INVENTION

Hereinafter, the present invention will be described in detail including the best mode thereof. The base film according to the present invention is a base film of the pressure sensitive adhesive sheet to be adhered on the semiconductor wafer, and it is constituted from,
(A) the layer comprising the cured product of which the composition including urethane (meth)acrylate oligomer and the thiol group containing compound are carried out with the energy ray curing (hereinafter, it may be abbreviated to "energy ray cured layer"), and
(B) the layer comprising thermoplastic resin (hereinafter, it may be abbreviated to "thermoplastic resin layer").

[(A) the Energy Ray Cured Layer]

The energy ray cured layer which is one of a constituting layer of the base film includes urethane (meth)acrylate oligomer and the thiol group containing compound and it is a cured product of which the composition including an energy ray curable monomer being cured by the energy ray depending on the needs.

Urethane (meth)acrylate oligomer is a compound comprising (meth)acryloyl group and the urethane bond. Such urethane (meth)acrylate oligomer is obtained by reacting (meth)acrylate comprising the hydroxyl group, with the end terminal isocyanate urethane prepolymer obtained by reacting the polyol compounds such as the polyester type or the polyether type with the polyvalent isocyanate compounds. Note that, in the present specification, (meth)acryl is used in a context which includes both acryl and methacryl.

The polyol compound is not particularly limited as long as it is a compound having two or more hydroxyl groups and those already known can be used. Specifically, for example, it may be any of alkylene diol, polyether type polyol, polyester type polyol, polycarbonate type polyol; however a further better effect can be obtained by using the polyether type polyol. Also, as long as it is a polyol, it is not particularly limited; and it may be bifunctional diol, trifunctional triol, further polyol of tetrafunctional or more; however from the point of easiness to obtain, versatility, and reactivity or so, it is particularly preferable to use diol. Therefore, polyether type diol is preferably used.

Polyether type diol which is a representative example of the polyether type polyol compounds is generally expressed by HO—(—R—O—)n-H. Here, R is a bivalent hydrocarbon group, preferably alykylene group, further preferably alkylene group having carbon atoms of 1 to 6, and particularly preferably alkylene group having carbon atoms of 3 or 4. Also, among alkylene groups having carbon atoms of 1 to 6; ethylene, propylene, or tetramethylene are preferable, and propylene or tetramethylene is particularly preferable. Therefore, as particularly preferable polyether type diol, polyethylene glycol, polypropylene glycol, polytetramethylene glycol may be mentioned; and as particularly preferable polyether type diol, polypropylene glycol, polytetramethylene glycol may be mentioned. "n" is a repeating number of (—R—O—); and it is preferably 10 to 250 or so, more preferably it is 25 to 205 or so, and particularly preferably it is 40 to 185 or so. When "n" is smaller than 10, the urethane bond concentration of urethane (meth)acrylate oligomer increases, and compressive stress of the energy ray cured layer (A) increases. When "n" is larger than 250, there is a risk that the compressive stress may become difficult to lower.

Due to the reaction between polyether type diol and the polyvalent isocyanate compound, the end terminal isyocyanate urethane prepolymer introduced with the ether bonding part (—(—R—O—)n-) is generated. By using such polyether type diol, urethane (meth)acrylate oligomer comprises the constituting unit derived from polyether type diol.

As the polybasic acid component used for the production of the polyester type polyol compound, those known as various polybasic acid component can be used. Specifically, for example dibasic acid such as adipic acid, maleic acid, succinic acid, oxalic acid, fumaric acid, malonic acid, glutaric acid, pimelic acid, azelaic acid, sebacic acid, suberic acid or so; aromatic polybasic acids, anhydride corresponding thereof or the derivatives thereof or the dimer acid, hydrogenated dimer acid or so may be mentioned. Note that, in order to provide suitable hardness to the coated film, it is preferable to use the aromatic polybasic acid. As the aromatic polybasic acid, for example, dibasic acid such as phthalic acid anhydride, isophthalic acid, terephthalic acid, 2,6-naphthalene dicarboxylic acid or so, polybasic acid such as trimellitic acid, pyrimellitic acid or so, and the acid anhydride corresponding thereof, or the derivative thereof or so may be mentioned. Note that, for said esterification reaction, known various catalyst may be used depending on the needs. As the catalyst, for example, tin compounds such as dibutyl tin oxide or stannous octate or so, alkoxy titanium such as tetrabutyl titanate, tetrapropyl titanate or so may be mentioned.

As for the polycarbonate type polyol compound, it is not particularly limited, and those known can be used. Specifically, for example, the reaction product between the aforementioned glycols and alkylene carbonate or so may be mentioned.

As for the molecular weight calculated form the diol hydroxyl value of the polyol compound, 1000 to 10000 or so is preferable, and 2000 to 9000 or so is preferable. If the molecular weight is lower than 1000, then the crosslinking density of urethane (meth)acrylate oligomer becomes high, and the compressive stress of the energy ray cured layer (A) becomes high. When the molecular weight is too high, the urethane bond concentration becomes low, and the compressive stress may become difficult to lower in some cases.

Note that, the molecular weight of the polyether type polyol compound is; the number of polyether type polyol functional group×56.11×1000/hydroxyl value [mgKOH/g], and it is a value calculated from the hydroxyl value of the polyether type polyol compound.

As for the polyvalent compound, aliphatic polyisocyanates such as tetramethylene diisocyanate, hexamethylene diisocyanate, trimethylhexamethylene diisocyanate or so; alicyclic diisocyanates such as isophorone diisocyanate, norbornane diisocyanate, dicyclohexylmethane-4,4'-diisocyanate, dicyclohexylmethane-2,4'-diisocyanate, ω,ω'-diisocyanate dimethylcyclohexane or so; aromatic diisocyanates such as 4,4'-diphenylmethane diisocyanate, tolylene diisocyanate, xylylene diisocyanate, tolidine diisocyanate, tetramethylenexylylene diisocyanate, naphthalene-1,5-diisocyanate or so may be mentioned. Among these, isophorone diisocyanate or hexamethylene diisocyanate, xylylene diisocyanate are preferably used since the viscosity of urethane (meth)acrylate oligomer can be maintained low, and the handling property can be good.

To the end terminal isocyanate urethane prepolymer obtained by reacting the above mentioned polyol compound and the polyvalent isocyanate compound, (meth)acrylate comprising the hydroxyl group is reacted to obtain urethane (meth)acrylate oligomer.

It is not particularly limited as for (meth)acrylate comprising the hydroxyl group as long as it is a compound comprising hydroxyl group and (meth)acryloyl group in one molecule, and those known can be used. Specifically, for example, hydroxyl group containing (meth)acrylate amide such as N-methylol(meth)acrylic amide, hydroxyalkyl (meth)acrylate such as 2-hydroxyethyl(meth)acrylate, 2-hydroxypropyl(meth)acrylate, 4-hydroxybutyl(meth)acrylate, 4-hydroxycyclohexyl(meth)acrylate, 5-hydroxycyclooctyl (meth)acrylate, 2-hydroxy-3-phenyloxypropyl(meth)acrylate, pentaerythritol(meth)acrylate, polyethyleneglycolmono (meth)acrylate, polypropyleneglycolmono(meth)acrylate or so; the reaction product obtained by reacting (meth)acrylic acid and diglycidyl esters such as vinyl alcohol, vinyl phenol, bisphenol A or so may be mentioned.

As for the condition for reacting the end terminal isocyanate urethane polymer and (meth)acrylate comprising the hydroxyl group, the end terminal isocyanate urethane prepolymer and (meth)acrylate comprising the hydroxyl group may be reacted with the solvent depending on the needs, under the presence of the catalyst at 60 to 100° C., for 1 to 4 hours.

The weight average molecular weight (the polystyrene conversion value by the gel permeation chromatography) of urethane (meth)acrylate oligomer obtained as such is not particularly limited, however usually it is preferably 1000 to 100000 or so, and more preferably it is 2000 to 80000. By having the weight average molecular weight to 1000 or higher, the breaking elongation of the energy ray cured layer can be improved, and by having it lower than 100000, the resin viscosity of urethane (meth)acrylate oligomer can be made lower, and the handling property of the coating liquid for the film forming is improved.

The obtained urethane (meth)acrylate oligomer comprises the photopolymerizable double bond in the molecule, polymerize cured by the energy ray irradiation and has property to form a coating film. The above mentioned urethane (meth)acrylate oligomer may be used alone, or it may be a combination of two types or more.

The thiol group containing compound is not particularly limited as long as it is a compound comprising at least one thiol group in the molecule, and those known can be used. Specifically, nonyl mercaptan, 1-dodecanthiol, 1,2-ethanedithiol, 1,3-propanedithiol, triazinethiol, triazinedithiol, triazinetrithiol, 1,2,3-propanetrithiol, tetraethylene glycol-bis(3-mercaptopropionate), trimethylolpropanetris(3-mercaptopropionate), pentaerythritoltetrakis(3-mercaptopropionate), pentaerythritoltetrakisthiolglucollate, dipentaerythritolhexakis(3-mercaptopropionate), tris[(3-mercaptopropionyloxy)-ethyl]-isocyanurate, 1,4-bis(3-mercaptobutryloxy)butane, pentaerythritol tetrakis(3-mercaptobutylate), 1,3,5-tris(3-mercaptobutyloxyethyl)-1,3,5-triazine-2,4,6-(1H,3H,5H)-trione or so may be mentioned.

The content of the thiol group containing compound is preferably 2 mmol or more, more preferably 3 to 100 mmol, and further preferably 4 to 85 mmol with respect to 100 g (solid portion) of urethane (meth)acrylate oligomer. By having the content of the thiol group containing compound of 2 mmol or more, the energy ray cured layer (A) shows specific viscoelasticity which will be described in below, and the height difference of the wafer surface with high bumps can be relieved. On the other hand, if the amount of the thiol group containing compound is too much, the elasticity of the energy ray cured layer (A) declines significantly, and when the pressure sensitive adhesive sheet using the base film is wound into a roll form, the constituting resin of the energy ray cured layer (A) ooze out from the side part of the roll, thus the long term storage of the roll becomes difficult. By having the content of the thiol group containing compound to 100 mmol or less, said compound is suppressed from remaining as the uncured product, and the resin is prevented from oozing out from the side part of the roll.

The molecular weight of the thiol group containing compound is preferably 200 to 3000, and more preferably it is 300 to 2000. If the molecular weight of the thiol group containing compound exceeds 3000, the compatibility between the urethane (meth)acrylate oligomer declines, and the film forming property of the energy ray cured product declines.

It may be difficult to form the film with the above mentioned urethane (meth)acrylate oligomer and the thiol group containing compound; hence, usually, after forming the film by mixing the energy ray polymerizable monomer, these are cured to obtain the energy ray cured layer. The energy ray curable monomer comprises energy ray polymerizable double bond in the molecule, and particularly in the present invention, the acrylate based compound comprising relatively bulky group is preferably used.

As the specific examples of the energy ray curable monomer, (meth)acrylate having the alkyl group with the carbon atoms of 1 to 30 such as methyl(meth)acrylate, ethyl(meth)acrylate, n-propyl(meth)acrylate, isopropyl(meth)acrylate, n-butyl(meth)acrylate, isobutyl(meth)acrylate, t-butyl(meth)acrylate, n-pentyl(meth)acrylate, n-hexyl(meth)acrylate, 2-ethylhexyl(meth)acrylate, n-octyl(meth)acrylate, nonyl(meth)acrylate, decyl(meth)acrylate, undecyl(meth)acrylate, dodecyl(meth)acrylate, tridecyl(meth)acrylate, tetradecyl(meth)acrylate, hexadecyl(meth)acrylate, octadecyl(meth)acrylate, eicosyl(meth)acrylate or so; (meth)acrylate having alicyclic structure such as isobonyl(meth)acrylate, dicyclopentenyl(meth)acrylate, dicyclopentanyl(meth)acrylate, dicyclopentenyloxy(meth)acrylate, cyclohexyl(meth)acrylate, adamantine(meth)acrylate or so; (meth)acrylate having aromatic structure such as phenylhydroxypropyl acrylate, benzyl acrylate, 2-hydroxy-3-phenoxypropyl acrylate or so; (meth)acrylate having heterocyclic structure such as tetrahydrofurfuryl(meth)acrylate, morpholine acrylate or so; vinyl compounds such as styrene, hydroxyethylvinylether, hydroxybutylvinylether, N-vinylformamide, N-vinylpyrrolidone or N-vinylcaprolactum or so may be mentioned. Also, depending on the needs, polyfunctional (meth)acrylate may be used.

Among these, from the point of the compatibility with urethane (meth)acrylate oligomer, it is preferable to use (meth)acrylate having the alicyclic structure having relatively bulky group, (meth)acrylate having the aromatic structure, (meth)acrylate having hetrocyclic structure or so.

The used amount of the this energy ray curable monomer is preferably 10 to 500 parts by weight, and more preferably 30 to 300 parts by weight, with respect to 100 parts by weight (solid portion) of urethane (meth)acrylate oligomer.

As for the method of forming the film, the method called casting film forming can be preferably used. Specifically, the composition of the liquid form (the liquid product of which the above mentioned mixture is diluted with the solvent depending on the needs), is casted into a thin film form, for example on the process sheet, then it is made into a film by polymerize curing by irradiating the energy ray to the coated film. According to such forming method, the stress applied to the resin during the film forming is small, and only few fisheyes are formed. Also, the evenness of the film thickness is high, and the accuracy of the thickness is usually within 2%. As for the energy ray, specifically, ultraviolet ray, and electron beam or so can be used. Also, the irradiation amount thereof varies depending on the type of the energy ray, and for example when using the ultraviolet ray, the ultraviolet ray intensity is 50 to 300 mW/cm$^2$ or so, and the ultraviolet ray irradiation amount are preferably 100 to 1200 mJ/cm$^2$ or so.

In case of using the ultraviolet ray as the energy ray during the film forming, by blending the photopolymerization initiator to said composition, the reaction may be carried out efficiently. As for such photopolymerization initiator, the photopolymerization initiators such as benzoin compounds, acetophenone compounds, acylphosphinoxide compounds, titanocene compounds, thioxanthone compounds, peroxide compounds or so; the photosensitizers such as amine or quinone or so may be mentioned, and specifically 1-hydroxycyclohexylphenylketone, 2-hydroxy-2-methyl-1-phenyl-propane-1-one, benzoin, benzoinmethylether, benzomethylether, benzoinisopropylether or so may be mentioned.

The used amount of the photopolymerization initiator is preferably 0.05 to 15 parts by weight, more preferably 0.1 to 10 parts by weight and particularly preferably 0.3 to 5 parts by weight, with respect to total 100 parts by weight of urethane (meth)acrylate oligomer and the energy ray curable monomer.

Also, in the above mentioned composition, the inorganic filler such as calcium carbonate, silica, mica or so, and the metal filler such as iron, lead or so may be added. Further, besides the above mentioned components, additives such as the coloring agent of pigment, dyes or so may be comprised in the energy ray cured layer (A).

The above mentioned energy ray cured layer (A) constitutes the base film by laminating with the thermoplastic resin layer (B) which will be described in below. The energy ray cured layer (A) is formed into a film on the process sheet as mentioned in the above, and it may be laminated with the thermoplastic resin layer (B), or the energy ray cured layer (A) may be directly formed on the thermoplastic resin layer (B).

The obtained energy ray cured layer (A) exhibits specific viscoelasticity when the bumps formed on the wafer surface are pressed, and rapidly deforms depending on the shape of the bumps to relieve the stress caused by the height difference of the bumps; hence even if the bumps are pressed, the bumps do not collapse. Also, the residual stress after the deformation is small, thus the wafer is stably held, and the generation of the dimples and the cracks can be suppressed.

The torsion storage elasticity of the energy ray cured layer (A) is preferably 0.1 to 6 MPa, more preferably 0.3 to 3 MPa, and particularly preferably 0.5 to 2 MPa. When the torsion storage elasticity is within the above range, the energy ray cured layer (A) will lead to the physical property of the pressure sensitive adhesive sheet which can prevent the collapse of the bumps or the dimples.

The compressive stress of the pressure sensitive adhesive sheet described in below can be regulated to a predetermined range, by the thickness of the energy ray cured layer (A), or by using particular urethane acrylate oligomer or the thiol group containing compound.

[(B) the Thermoplastic Resin Layer]

As for the thermoplastic resin layer (B), the thermoplastic resins such as the polyester resins such as polyethyleneterephthalate (PET) or so; polyolefin based resins such as polyethylene (PE), polypropylene (PP) or so; polyimide (PI), polyetheretherketone (PEEK), polyvinylchloride (PVC), polyvinylidenechloride based resin, polyamide based resin, polyurethane based resin, polystyrene based resin, acrylic resin, fluorine based resin, cellulose based resin, polycarbonate based resin or so can be used. These thermoplastic resin can be used as single layer or it may be used by stacking plurality of layers.

The thermoplastic resin (B) may be formed on one side of the energy ray cured layer (A), or it may be formed both sides.

The energy ray cured layer (A) deforms relatively easily as mentioned in the above, hence it is difficult to maintain the shape. Therefore, in case the base film is formed only by the energy ray cured layer (A), the handling property is bad, and the operating efficiency declines. By laminating the thermoplastic resin layer (B) which is relatively hard, the base film having a suitable shape maintaining property and excellent handling property can be obtained.

The thickness of the thermoplastic resin layer (B) is not particularly limited, and preferably it is 10 to 1000 μm, and more preferably 20 to 500 μm.

[The Base Film]

The base film is formed by laminating the energy ray cured layer (A) and the thermoplastic resin layer (B), as mentioned in the above. The energy ray cured layer (A) and the thermoplastic resin layer (B) may be directly laminated, or it may be adhered via the adhesive agent layer.

The production method of the base film is not particularly limited, and for example the composition including said urethane (meth)acrylate oligomer, the thiol group containing compound and the energy ray curable monomer which is added depending on the needs are casted into a thin film form on the process sheet, then the coated film is dried depending on the needs. Then, small amount of the energy ray is irradiated to the coated film to form the semicured layer by partially carrying out the polymerization curing, and the thermoplastic layer (B) is laminated on the semicured layer and the energy ray is irradiated to cure the semicured layer to obtain the energy ray cured layer (A), and the base film is obtained by removing the process sheet.

Also, by laminating the thermoplastic resin layer (B) to the energy ray cured layer (A) face of the layered body consisting of the energy ray cured layer (A) and the thermoplastic resin layer (B), the base film having the thermoplastic resin layer (B) on the both sides of the energy ray cured layer (A) can be obtained.

The pressure sensitive adhesive sheet according to the present invention is formed by having a pressure sensitive adhesive agent layer (C) on the one side of the above mentioned base film. In order to improve the adhesiveness between the pressure sensitive adhesive agent layer, the corona treatment may be carried out or the primer layer may be provided to the surface of the base film formed with the pressure sensitive adhesive agent layer, preferably to the surface of the energy ray cured layer (A).

[(C) the Pressure Sensitive Adhesive Agent Layer]

The type of the pressure sensitive adhesive agent layer (C) is not particularly limited as long as it has suitable re-releasing property against the wafer, and it may be formed by the conventionally known pressure sensitive adhesive agent layer. As for such pressure sensitive adhesive agent layer, it is not particularly limited, and for examples, the pressure sensitive adhesive agent layers such as rubber based, acrylic based, silicone based, polyvinylether or so may be used. Also, the energy ray cured pressure sensitive adhesive agent which becomes re-releasable by curing due to the energy ray irradiation, the pressure sensitive adhesive agent layer of heat foaming type, the water swelling type or so can be used as well.

As for the energy ray curable (ultraviolet ray curable, electron beam curable) pressure sensitive adhesive agent, the ultraviolet ray curable pressure sensitive adhesive agent is preferable. As specific examples of such energy ray curable pressure sensitive adhesive agent, it is described in JP Patent Application Laid Open No. S60-196956 and JP Patent Application Laid Open No. S60-223139. Also, as the water swelling type pressure sensitive adhesive agent, for example, those described in JP Patent Application Laid Open No. H05-77284, JP Patent Application Laid Open No. H06-101455 are preferably used.

The thickness of the pressure sensitive adhesive agent layer (C) is not particularly limited, however it is preferably within the range of 5 to 200 μm, and more preferably 10 to 120 μm.

Note that, on the pressure sensitive adhesive agent layer, the release sheet may be laminated in order to protect the pressure sensitive adhesive agent layer before the use thereof. The release sheet is not particularly limited, and the release sheet base treated with the releasing agent can be used. As for the release sheet base, the film made of the resin such as polyethyleneterephthalate, polybutyleneterephthalate, polypropylene, polyethylene or so, and the foamed film thereof; or papers such as a glassine paper, a coat paper, and a laminated paper or so which has been release treated by a silicone, florine and long chain alkyl group containing carbamate or so may be used.

The method of providing the pressure sensitive adhesive agent layer to the base film surface may be carried out by transferring the pressure sensitive adhesive agent layer, which is formed by coating on the release sheet so that it has predetermined thickness to the base film surface, or it may be formed by directly coating the pressure sensitive adhesive agent layer to the base film surface.

[The Pressure Sensitive Adhesive Sheet]

The pressure sensitive adhesive sheet according to the present invention is formed by providing the pressure sensitive adhesive agent layer (C) to the one side of the above mentioned base film. In case the base film has the two layer structure wherein the thermoplastic resin layer (B) is laminated to the one side of the energy ray cured layer (A), the pressure sensitive adhesive agent layer (C) is preferably provided on the surface of the energy ray cured layer (A). The pressure sensitive adhesive sheet according to the present invention can be any shape such as a tape shape, a label shape or so.

The specific viscoelasticity of the pressure sensitive adhesive sheet can be easily evaluated from the compressive stress which is calculated from the load measured when the test samples having bumps with the predetermined shape is pressed to the pressure sensitive adhesive sheet in a predetermined speed. The detail of the measurement will be described in below. The compressive stress of the pressure sensitive adhesive sheet at 23° C. is preferably 0.01 to 1.0 MPa, more preferably 0.05 to 0.7 MPa, and particularly preferably 0.06 to 0.3 MPa. By having the compressive stress within said range, the pressure sensitive adhesive sheet shows the above mentioned viscoelasticity and prevents the collapse of the bumps or the generation of the dimples, and prevents the resin from oozing out.

The thickness of the energy ray cured layer (A) and the pressure sensitive adhesive agent layer (C) of the pressure sensitive adhesive sheet of the present invention is not particularly limited, however in case the pressure sensitive adhesive sheet is used to the circuit face of the wafer with the bumps, it is preferable to accordingly set the thickness of the energy ray cured layer (A) and the pressure sensitive adhesive agent layer (C) depending on the height of the bumps on the circuit face. The height of the bumps is the height from the flat face of the circuit face (the portion where the bumps are not formed) to the tip of the bump, and for the height of the plurality of the bumps, it will be defined by the arithmetical mean.

[The Processing Method of the Semiconductor Wafer]

The pressure sensitive adhesive sheet of the present invention can be used for the processing of the semiconductor wafer as shown in the below.

(The Wafer Backside Grinding Method)

During the backside grinding of the wafer, the pressure sensitive adhesive sheet is adhered to the circuit face of the semiconductor wafer formed with the circuit on the surface to protect the circuit face, and grind the backside of the wafer, thereby the wafer is processed to a predetermined thickness.

The semiconductor wafer may be a silicon wafer, or a compound semiconductor wafer such as gallium/arsenide or so. The circuit is formed on the wafer surface by various method including the conventionally widely used methods such as an etching method, and a lift-off method or so. During the circuit forming step of the semiconductor wafer, the predetermined circuit is formed. The thickness of such wafer before grinding is not particularly limited, and usually it is 500 to 1000 µm or so. Also, the surface shape of the semiconductor wafer is not particularly limited, and the pressure sensitive adhesive sheet of the present invention is preferably used for the surface protection of the wafer having the bumps on the circuit surface.

The pressure sensitive adhesive sheet of the present invention comprises the above mentioned energy ray cured layer (A) and the pressure sensitive adhesive agent layer (C), and has the viscoelasticity capable of following the height differences of the bumps. Therefore, it is embedded to the wafer face formed with the bumps, and solves the height differences, and allows maintaining the wafer flat. Also, since it has high following property against the surface shape of the wafer, even if a strong shear strength is applied to the wafer during the wafer backside grinding, the vibration of the wafer, and the shifting of the position can be prevented, and furthermore, the backside of the wafer can be made flat, and can be ground extremely thin. Also, the base film includes the energy ray cured layer (A) thus the bumps do not collapse even when it is pressed against the base film.

The backside grinding is performed by known methods using the grinder and the vacuum table or so for fixing the wafer while the pressure sensitive adhesive sheet is adhered. After the backside grinding step, the treatment to remove the fractured layer due to the grinding may be performed. The thickness of the semiconductor wafer after the backside grinding is not particularly limited, however it is preferably 10 to 400 µm, and particularly preferably 25 to 300 µm.

After the backside grinding, the pressure sensitive adhesive sheet is released from the circuit face. According to the pressure sensitive adhesive sheet of the present invention, the wafer can be securely held during the backside grinding of the wafer, and also can prevent the penetration of the grinding water into the circuit surface.

(The Wafer Dicing Method)

The pressure sensitive adhesive sheet of the present invention can be used as the dicing sheet as well. When using as the dicing sheet, the pressure sensitive adhesive sheet of the present invention is adhered to the wafer, then the wafer is cut. Particularly, it is suitable in case the pressure sensitive adhesive sheet of the present invention is adhered to the circuit face of the wafer, then cutting the wafer while protecting the circuit face by the pressure sensitive adhesive sheet. The adhering of the dicing sheet is generally carried out by the device called mounter, however it is not limited thereto.

The cutting method of the semiconductor wafer is not particularly limited. As for an example, the method of forming chips from a wafer by known methods such as a method using a rotating round blade of a dicer or so after fixing the peripheral portion of the dicing tape by the ring flame when cutting the wafer may be mentioned. Alternatively, it may be a dicing method using a laser light.

(Dicing Before Grinding Method)

Furthermore, the pressure sensitive adhesive sheet of the present invention is particularly preferably used to form the chips from the wafer having a high bumps using the dicing before grinding method. Specifically, it is preferably used for the processing method of the semiconductor wafer including the forming of grooves having a depth of cut shallower than a wafer thickness from the surface of the semiconductor wafer formed with the circuit having bumps; adhering the pressure sensitive adhesive sheet as for the surface protection sheet; thinning of the wafer thickness by the backside grinding of said semiconductor wafer, and dividing into individual chips.

By using the pressure sensitive adhesive sheet of the present invention at this point, since high sealing property can be obtained between the chip and the pressure sensitive adhesive agent layer, the grinding water does not leak into the circuit surface; hence the contamination of the chip can be prevented.

Then, the chips are picked up by the predetermined method. Also, before the pickup of the chips, the chips which are aligned in the wafer shape are transferred to other pressure sensitive adhesive sheets, and then the chips may be picked up as well.

EXAMPLES

Hereinafter, the present invention will be described using the examples; however the present invention is not to be limited thereto. Note that, in the examples and the comparative examples shown in below, each physical property were evaluated as descried in the following.

(The Torsion Storage Elasticity)

The energy ray cured layer having a diameter of 8 mm and the thickness of 3 mm was prepared, and the torsion storage elasticity was measured at 1 Hz and 23° C. using the viscoelasticity measuring apparatus (the apparatus name: DYNAMIC ANALYZER RADII manufactured by RHEOMETRICS Inc).

(The Compressive Stress)

The pressure sensitive adhesive sheet comprising the thermoplastic resin layer, the energy ray cured layer, and the acrylic pressure sensitive adhesive agent layer was cut into a shape having the length 15 mm×the width 15 mm. The release sheet was removed from the pressure sensitive adhesive sheet, and the chips having the bumps (the height of the bumps of 250 µm, and the bump pitch of 500 µm) formed by the silicon wafer having the length 10 mm×the width 10 mm×the thickness 200 µm was pressed to the exposed pressure sensitive adhesive agent layer face till the bumps reaches the depth of 140 µm, using the tensile and compression testing systems [the product name "INSTRON 5581", made by INSTRON], at the speed of 0.6 mm/min so that the bumps at the entire flat face of the chips contacts. The load (the compressive load) applied to the silicon wafer chip from the pressure sensitive adhesive sheet at that moment was measured. It was carried out under the condition of the temperature at 23° C., and the relative humidity of 50%. The compressive stress was calculated from the measured compressive load and the surface area of the bumps of the entire flat face of being pressed.

Note that, the diameter of the bump was 280 µm, and the measurement was carried out assuming that the bump was pressed into about the half thereof. The surface area (39.9 mm$^2$) of the bumps of the entire flat face of the chip when pressed in by 140 μm is calculated from the surface area of one bump and the number of the bumps (324), and the compressive stress was calculated from the below equation (1).

$$\text{The compressive stress} = \text{The compressive load}/\text{The surface area of the bump of the entire flat face of the chips} \quad (1)$$

(The generation of the dimples and the cracks)

The wafer with the solder bump was adhered to the pressure sensitive adhesive sheet (the 8 inch silicon wafer in which the chips having the chip size of the length 10 mm×the width 10 mm are aligned, the height of the bumps 250 μm, the bump pitch 500 μm, the total thickness 720 μm), then it was fixed for grinding till the thickness was 250 μm (using the grinder DGP 8760 made by DISCO Corporation). Then, by visual observation of the wafer backside, it was verified whether the dimples were generated or not at the part corresponding to the wafer backside of the bumps. Those without the dimples were defined A, those with very little dimples but has no problem for the practical use was defined B, and those with obvious dimples were defined C. Also, the presence of the cracks of the wafer (the fissure or the crack of the wafer) was verified by a visual observation.

(The Height Difference)

The pressure sensitive adhesive sheet was adhered to the wafer with the bumps having a bump height of 250 μm using the laminator "RAD 3510" made by Lintec Corporation, then the total thickness "A" having the bumps (the distance from the wafer backside to the base film side of the pressure sensitive adhesive sheet), and the total thickness "B" without the bumps were immediately measured using the fixed pressure thickness measuring instrument: PG-02 made by TECLOCK Corporation, then the height difference was calculated as "A-B". The smaller the height difference is, the more relieved the height differences caused by the bump height is due to the pressure sensitive adhesive sheet.

(The Immersion of the Grinding Water)

After adhering the pressure sensitive adhesive sheet to the wafer surface, the wafer backside was ground till it reaches the thickness of 250 μm while spraying the water, then the pressure sensitive adhesive sheet was released from the wafer surface, and the presence of the water immersion to the wafer surface was verified by the optical digital microscope (magnification of 100×).

(The Embedding Property)

The pressure sensitive adhesive sheet was adhered to the circuit face of the wafer with the bumps using the laminator "RAD 3510" made by Lintec Corporation, then it was immediately observed using the optical digital microscope (the magnification of 300×), thereby the embedding distance between the bumps were measured. Note that, the embedding distance between the bumps is defined as described in below.

The four tops of the bumps at the close proximity were connected with a straight line to form an imaginary square. The diagonal line of the square was measured, then the diameter of the bump was subtracted from the length of the diagonal line, thereby the space between the bumps was determined. The distance where the pressure sensitive adhesive agent layer and the wafer surface were adhered on the diagonal line were measured, thereby the embedding distance between the bumps were determined.

(The embedding distance/the space between the bumps)×100 was calculated to determine the embedding property (%). The embedding property is a standard of the adhesiveness of the pressure sensitive adhesive sheet against the space between the bumps; and the higher the embedding property is, it indicates that the pressure sensitive adhesive sheet and the wafer with the bumps are adhered without a space. In case the embedding property is low, it indicates that the adherence between the bottom portion of the bump and the pressure sensitive adhesive sheet is insufficient.

(The effusion)

The pressure sensitive adhesive sheet being produced was wound into a roll form, and the presence of the effusion of the resin at the side part of the roll after one week of the production was verified using the optical digital microscope (the magnification 100×).

Example 1

At the end terminal of the end terminal isocyanate urethane prepolymer which is obtained by polymerizing the polypropylene glycol having the molecular weight of 4000 calculated from the hydroxyl value (hereinafter it will be referred as PPG 4000) and the isophorone diisocyanate (hereinafter, it will be referred as IPDI), 2-hydroxyethylmethacrylate (hereinafter it will be referred as HEMA) was reacted; thereby polyetherpolyol based urethane (meth)acrylate oligomer having the weight average molecular weight of 50000 was obtained. Note that, said weight average molecular weight is a value obtained using the commercially available molecular weight measuring apparatus (the product name "HLC-8220GPC", the column product name: "TSKGel SuperHZM-M", made by TOSOH Corporation; the eluent: tetrahydrofuran made by TOSOH Corporation) (same applies to hereinbelow as well).

100 g (the solid portion) of the obtained polyetherpolyol based urethane (meth)acrylate oligomer, 140 g (the solid portion) of isobornyl acrylate as the energy ray curable monomer, 160 g (the solid portion) of 2-hydroxy-3-phenoxypropylacrylate, 8.0 g (20.1 mmol) of trimethylolpropane tris(3-mercaptopropyonate) (TMMP, trifunctional, the solid portion concentration 100 wt %: made by SAKAI CHEMICAL INDUSTRY CO., LTD) as thiol group containing compound, and 4 g of 2-hydroxy-2-methyl-1-phenyl-propane-1-one as the photopolymerizable initiator (DAROCUR 1173, the solid portion concentration 100 wt %: made by BASF The Chemical Company) were added to obtain the composition (the energy ray curable composition which is in a liquid state at an ambient temperature (the viscosity η=2500 mPa·s, 25° C.)).

The above mentioned composition was coated on the polyethyleneterephthalate (PET) film based release film (the product name "SP-PET3811" having thickness of 38 μm, made by Lintec Corporation) by the fountain die method so that the thickness becomes 300 μm to form the coated film; then the semi-cured layer was obtained by irradiating the ultraviolet ray from the coated film side. As the ultraviolet ray irradiating apparatus, the belt conveyor type ultraviolet irradiator (ECS-401GX: made by EYE GRAPHICS CO., LTD), the high pressure mercury lamp (H04-L41: made by EYE GRAPHICS CO., LTD) was used as the ultra violet ray source {the irradiation condition: lamp height 150 mm, the lamp output 3 kW (the conversion output 120 mW/cm), the light wave length 365 nm with illumination of 271 mW/cm$^2$, the luminous energy of 177 mJ/cm$^2$ (the actionmeter:UV-351, made by ORC MANUFACTURING CO., LTD)}. Then, immediately after the irradiation, the polyethyleneterephthalate (PET) film (T-100, the thickness of 75 μm: made by Mitsubishi Polyester Film LLC) was laminated, and the ultraviolet ray irradiation was further carried from the laminated PET film for four times {the irradiation condition: lamp height 150 mm, the lamp output 3 kW (the conversion output 120 mW/cm), the light wave length 365 nm with illumination of 271 mW/cm$^2$, the luminous energy of 1200 mJ/cm$^2$ (the actionmeter: UV-351, made by ORC MANUFACTURING CO., LTD)}, to obtain the energy ray cured layer by crosslinking curing the semi-cured layer. Then by removing the cast process sheet, the base film having the total thickness of 375 μm wherein the energy ray cured layer (300 μm) and the thermoplastic resin layer (75 μm) are stacked.

Apart from the above, 70 parts by weight of butyl acrylate, 30 parts by weight of 2-hydroxylethylacrylate were solution polymerized in the ethyl acetate solution, thereby the acrylic copolymer having the weight average molecular weight of 500,000 and the glass transition temperature of −7° C. was obtained. Then, 100 parts by weight of the solid portion of this acrylic copolymer, and 8 parts by weight of methacryloyloxyethyl isocyanate (80 equivalents with respect to 100 equivalents of hydroxyl groups in the acrylic copolymer) were reacted; thereby the ethyl acetate solution (30% solution) of the ultraviolet ray curable acrylic copolymer comprising the polymerizable double bond in the molecule was obtained.

With respect to 100 parts by weight (solid portion) of this ultraviolet ray curable acrylic copolymer, 2.0 parts by weight (solid portion) of the polyvalent isocyanate compound (the product name "Coronate L" made by Nippon Polyurethane Co.), and 3.3 parts by weight of the photopolymerizable initiator (the product name IRGACURE 184, made by BASF The Chemical Company) were mixed and obtained the ultraviolet ray curable pressure sensitive adhesive agent composition. On the energy ray cured layer of the base film, the ultraviolet ray curable pressure sensitive adhesive agent composition was coated and dried to form the adhesive agent layer having the thickness of 50 μm; thereby obtained the pressure sensitive adhesive sheet. The evaluation results are shown in Table 1 and Table 2.

Example 2

The pressure sensitive adhesive sheet was obtained and the results were evaluated as same as the example 1 except for using 1.0 g (2.1 mmol) of tris[(3-mercaptopropionyloxy)-ethyl]isocyanurate (TEMPIC, trifunctional, the solid potion concentration 100 wt %; made by SAKAI CHEMICAL INDUSTRY CO., LTD) instead of 8 g of TMMP which was used as the thiol group containing compound. The results are shown in Table 1 and 2.

Example 3

The pressure sensitive adhesive sheet was obtained and evaluated as same as the example 1 except for changing the added amount of TMMP to 40.0 g (100.4 mmol) which was used as the thiol group containing compound in the example 1. The results are shown in Table 1 and 2.

Example 4

The pressure sensitive adhesive sheet was obtained and evaluated as same as the example 1 except for using 40.0 g (196.4 mmol) of 1-dodecane thiol (mono functional, the solid portion concentration 100 wt %; made by Sigma-Aldrich Co. LLC) instead of 8 g of TMMP which was used as the thiol group containing compound. The results are shown in Table 1 and 2.

Example 5

The pressure sensitive adhesive sheet was obtained and the results were evaluated as same as the example 1 except for using 8.0 g (21.5 mmol) of tetraethyleneglycol-bis(3-mercaptopropionate) (EGMP-4, bifunctional, the solid potion concentration 100 wt %; made by SAKAI CHEMICAL INDUSTRY CO., LTD) instead of 8 g of TMMP which was used as the thiol group containing compound. The results are shown in Table 1 and 2.

Example 6

The pressure sensitive adhesive sheet was obtained and the results were evaluated as same as the example 1 except for using 8.0 g (16.4 mmol) of pentaerythritoltetrakis(3-mercaptopropionate) (PEMP, tetrafunctional, the solid potion concentration 100 wt %; made by SAKAI CHEMICAL INDUSTRY CO., LTD) instead of 8 g of TMMP which was used as the thiol group containing compound. The results are shown in Table 1 and 2.

Example 7

The pressure sensitive adhesive sheet was obtained and the results were evaluated as same as the example 1 except for using 8.0 g (18.5 mmol) of pentaerythritoltetrakisthioglycolate (PETG, tetrafunctional, the solid potion concentration 100 wt %; made by SAKAI CHEMICAL INDUSTRY CO., LTD) instead of 8 g of TMMP which was used as the thiol group containing compound. The results are shown in Table 1 and 2.

Example 8

The pressure sensitive adhesive sheet was obtained and the results were evaluated as same as the example 1 except for using 8.0 g (10.2 mmol) of dipentaerythritolhexakis(3-mercaptopropionate) (DPMP, hexafunctional, the solid potion concentration 100 wt %; made by SAKAI CHEMICAL INDUSTRY CO., LTD) instead of 8 g of TMMP which was used as the thiol group containing compound. The results are shown in Table 1 and 2.

Example 9

The pressure sensitive adhesive sheet was obtained and the results were evaluated as same as the example 1 except for using 8.0 g (14.7 mmol) of pentaerythritoltetrakis(3-mercaptobutyrate) (Karenz MT™ PE1, the second degree tetrafunctional, the solid potion concentration 100 wt %; made by SHOWA DENKO K.K.) instead of 8 g of TMMP which was used as the thiol group containing compound. The results are shown in Table 1 and 2.

Example 10

The pressure sensitive adhesive sheet was obtained and the results were evaluated as same as the example 1 except for using 8.0 g (14.1 mmol) of 1,3,5-tris(3-mercaptobutyloxyethyl)-1,3,5-triazine-2,4,6-(1H,3H,5H)-trione (Karenz MT™ NR1, the second degree trifunctional, the solid potion concentration 100 wt %; made by SHOWA DENKO K.K.) instead of 8 g of TMMP which was used as the thiol group containing compound. The results are shown in Table 1 and 2.

Example 11

The pressure sensitive adhesive sheet was obtained and the results were evaluated as same as the example 1 except for using 8.0 g (27.2 mmol) of 1,4-bis(3-mercaptobutyryloxy)butane (Karenz MT™ BD1, the second degree bifunctional, the solid potion concentration 100 wt %; made by SHOWA DENKO K.K.) instead of 8 g of TMMP which was used as the thiol group containing compound. The results are shown in Table 1 and 2.

Example 12

The pressure sensitive adhesive sheet was obtained and evaluated as same as the example 1 except for changing the added amount of TMMP to 80.0 g (200.8 mmol) which was used as the thiol group containing compound in the example 1. The results are shown in Table 1 and 2.

Comparative Example 1

The pressure sensitive adhesive sheet was obtained and evaluated as same as the example 1 except for not adding the thiol group containing compound. The results are shown in Table 1 and 2.

Comparative Example 2

The pressure sensitive adhesive sheet was obtained and evaluated as same as the example 1 except that the energy ray cured layer as the base film was not formed, and the single layer film of polyethyleneterephthalate (PET) film (T-100, the thickness of 188 μm: made by Mitsubishi Polyester Film LLC) was used. The results are shown in Table 1 and 2.

TABLE 1

| | Energy ray cured layer | Adhesive sheet | |
|---|---|---|---|
| | Torsion storage elasticity [MPa] | Compressive load [N] | Compressive stress [MPa] |
| Example 1 | 0.7 | 2.5 | 0.06 |
| Example 2 | 1.3 | 5.2 | 0.13 |
| Example 3 | 0.2 | 0.7 | 0.02 |
| Example 4 | 0.2 | 0.6 | 0.02 |
| Example 5 | 0.9 | 3.2 | 0.08 |
| Example 6 | 0.7 | 2.6 | 0.07 |
| Example 7 | 0.6 | 2.6 | 0.07 |
| Example 8 | 0.6 | 2.4 | 0.06 |
| Example 9 | 0.8 | 2.7 | 0.07 |
| Example 10 | 0.8 | 2.6 | 0.07 |
| Example 11 | 1.0 | 3.3 | 0.08 |
| Example 12 | 0.1 | 0.4 | 0.01 |
| Comparative example 1 | 3.1 | 12.2 | 0.31 |
| Comparative example 2 | — | — | — |

TABLE 2

| | Dimples | Cracks | Height difference [mm] | Immersion of the grinding water | Embedding property [%] | Effusion |
|---|---|---|---|---|---|---|
| Exaple 1 | A | None | 68 | None | 71 | None |
| Exaple 2 | B | None | 80 | None | 66 | None |
| Exaple 3 | A | None | 58 | None | 76 | present |
| Exaple 4 | A | None | 55 | None | 75 | present |
| Exaple 5 | B | None | 72 | None | 70 | None |
| Exaple 6 | A | None | 69 | None | 72 | None |
| Exaple 7 | A | None | 69 | None | 72 | None |
| Exaple 8 | A | None | 65 | None | 71 | None |
| Exaple 9 | A | None | 70 | None | 72 | None |
| Exaple 10 | A | None | 69 | None | 72 | None |
| Exaple 11 | B | None | 73 | None | 70 | None |
| Exaple 12 | A | None | 45 | None | 91 | present |
| Comparative example 1 | C | present | 128 | None | 65 | None |
| Comparative example 2 | C | present | 287 | present | — | None |

The invention claimed is:

1. A pressure sensitive adhesive sheet to be adhered on a semiconductor wafer, comprising:
    a pressure sensitive adhesive layer on a base film,
    said base film comprising (A) a layer of a cured product in which a composition including a urethane (meth) acrylate oligomer, a thiol group containing compound, and an energy ray curable monomer is cured by an energy ray irradiation before adhering the pressure sensitive adhesive sheet to the semiconductor wafer, and (B) a thermoplastic resin layer,
    wherein a content of the thiol group containing compound of said composition is 2 to 100 mmol with respect to 100 g of urethane (meth)acrylate oligomer.

2. The pressure sensitive adhesive sheet as set forth in claim 1, wherein a content of the thiol group containing compound of said composition is 4 to 85 mmol with respect to 100 g of urethane (meth)acrylate oligomer.

3. The pressure sensitive adhesive sheet as set forth in claim 1, wherein a compressive stress of the pressure sensitive adhesive sheet at 23° C. is 0.05 to 7 MPa.

4. The pressure sensitive adhesive sheet as set forth in claim 1, wherein said layer (A) is formed on the thermoplastic resin layer (B).

5. The pressure sensitive adhesive sheet as set forth in claim 1, wherein the thermoplastic resin layer (B) comprises a plurality of layers.

6. The pressure sensitive adhesive sheet as set forth in claim 1, wherein the thiol group containing compound is selected from the group consisting of nonyl mercaptan, 1-dodecanthiol, 1,2-ethanedithiol, 1,3-propanedithiol, triazinethiol, triazinedithiol, triazinetrithiol, 1,2,3-propanetrithiol, tetraethyleneglycol-bis(3-mercaptopropionate), trimethylolpropanetris(3-mercaptopropionate), tris[(3-mercaptopropionyloxy)-ethyl]-isocyanurate, 1,4-bis(3-mercaptobutryloxy) butane, pentaerythritol tetrakis(3-mercaptobutylate), and 1,3,5-tris(3-mercaptobutyloxyethyl)-1,3,5-triazine-2,4,6-(1H,3H,5H)-trione.

7. The pressure sensitive adhesive sheet as set forth in claim 1, wherein the thermoplastic resin layer (B) comprises a thermoplastic resin selected from the group consisting of polyethyleneterephthalate, polyimide, polyetheretherketone, polyvinylchloride, polyvinylidenechloride, polyamide, polyurethane, an acrylic resin, a fluorine resin, a cellulose resin, and a polycarbonate resin.

8. The pressure sensitive adhesive sheet as set forth in claim 1, wherein the thermoplastic resin layer (B) comprises a thermoplastic resin selected from the group consisting of polyimide, polyetheretherketone, polyamide, polyurethane, a fluorine resin, a cellulose resin, and a polycarbonate resin.

9. The pressure sensitive adhesive sheet as set forth in claim 1, wherein the energy ray curable monomer comprises a (meth)acrylate having an alicylic structure.

10. The pressure sensitive adhesive sheet as set forth in claim 1, wherein the energy ray curable monomer comprises a (meth)acrylate having an aromatic structure.

11. The pressure sensitive adhesive sheet as set forth in claim 1, wherein the energy ray curable monomer comprises a (meth)acrylate having a heterocyclic structure.

* * * * *